(12) United States Patent
Isobe et al.

(10) Patent No.: US 6,388,476 B1
(45) Date of Patent: May 14, 2002

(54) SELF-SWITCHED CASCODE WRITE DRIVER

(75) Inventors: Yuji Isobe, Irvine; Chii-Fa Chiou, Lake Forest, both of CA (US)

(73) Assignee: Texas Instruments Incorporated, Dallas, TX (US)

( * ) Notice: Subject to any disclaimer, the term of this patent is extended or adjusted under 35 U.S.C. 154(b) by 1235 days.

(21) Appl. No.: 08/782,464

(22) Filed: Jan. 9, 1997

Related U.S. Application Data

(63) Continuation of application No. 08/482,241, filed on Jun. 7, 1995, now abandoned.

(51) Int. Cl.[7] .............................................. H03K 3/00
(52) U.S. Cl. ........................ 327/110; 327/588; 360/46
(58) Field of Search ............................ 360/46, 66, 67, 360/68; 327/588, 108–112, 423, 374–377

(56) References Cited

U.S. PATENT DOCUMENTS

| | | | |
|---|---|---|---|
| 4,480,230 A | * 10/1984 | Brehmer et al. ............. 330/255 |
| 4,551,772 A | * 11/1985 | Sliger ........................... 360/46 |
| 4,638,260 A | * 1/1987 | Hamley ....................... 330/254 |
| 4,639,794 A | 1/1987 | Ferrier ......................... 360/46 |
| 4,821,127 A | 4/1989 | Soga et al. .................... 360/66 |
| 4,956,720 A | 9/1990 | Tomisawa .................... 358/324 |
| 5,121,369 A | 6/1992 | Makansi ....................... 369/13 |
| 5,132,852 A | 7/1992 | Price, Jr. ....................... 360/46 |
| 5,168,395 A | 12/1992 | Klaassen et al. .............. 360/46 |
| 5,202,645 A | * 4/1993 | Phan et al. ................... 330/253 |
| 5,257,146 A | 10/1993 | Price, Jr. et al. .............. 360/67 |
| 5,287,231 A | 2/1994 | Shier et al. ................... 360/68 |
| 5,291,347 A | 3/1994 | Ngo et al. .................... 360/68 |
| 5,345,346 A | * 9/1994 | Brannon et al. .............. 360/67 |
| 5,386,328 A | 1/1995 | Chiou et al. .................. 360/68 |

* cited by examiner

*Primary Examiner*—Kenneth B. Wells
(74) *Attorney, Agent, or Firm*—W. Daniel Swayze, Jr.; W. James Brady; Frederick J. Telecky, Jr.

(57) ABSTRACT

A cascode H-bridge circuit with particular application to magnetic recording write driver circuits. The present invention avoids the process dependent limitations placed on the head voltage swing in the H-bridge circuits of the prior art. Whereas the circuits of the prior art attempt to increase head voltage swing by minimizing device voltage drops in the current path, the present invention inserts cascode transistors in the current path that have less than a one-volt voltage drop when active, yet allow the circuit to operate under a higher voltage supply with roughly twice the head voltage swing available in the same process in the prior art. By implementing a cascode configuration, the present invention is able to support head voltage swings in excess of the switch breakdown voltage ($BV_{CEO}$) without failure of the switches in the "off" state.

26 Claims, 5 Drawing Sheets

SELF-SWITCHED CASCODE WRITE DRIVER

This application is a continuation, application Ser. No. 08/482,241, filed Jun. 7, 1995 now abandoned.

BACKGROUND OF THE INVENTION

1. Field of the Invention

This invention relates to the field of analog circuits, and, in particular, to write circuitry for magnetic recording systems.

2. Background Art

In magnetic data recording systems, data information is recorded on a disk surface by individually modifying the magnetic orientation of small regions of the disk surface. This modification is performed by placing a strong, localized magnetic field of the desired orientation in close proximity to the selected region of the disk surface. In disk drives, the magnetic field is typically generated by a "write head" suspended from an arm over the disk surface. The write head contains an inductive coil capable of producing a localized electromagnetic field with direction and magnitude dependent on electrical current passed through the inductive coil. Data is written on the disk surface by changing current direction in the writing head. The apparatus used to direct current through the inductive coil of the write head is generally known as a "write driver."

Typically, H-bridge configurations are used for write drivers. A symbolic diagram of an H-bridge is shown in FIG. 1A. The inductive head (LHEAD) is coupled across nodes HX and HY. Upper switches S1 and S2 couple nodes HX and HY, respectively, to the positive voltage supply (VCC). Lower switches S3 and S4 couple nodes HX and HY, respectively, to current source IW. Current source IW is further coupled to a lower voltage supply or ground (GND) node. It is also possible to orient the H-bridge such that the current source is above the upper switches rather than below the lower switches. The upper switch may consist of NPN or PNP bipolar junction transistors (BJTs), or P-type field effect transistors (PFETs). NPN BJTs or Ntype FETs are typically used for the lower switches.

The switches of the write driver are used to steer the write current provided by constant current source IW through the inductor LHEAD. To steer current through LHEAD from node HX to node HY, upper switch S1 and lower switch S4 are closed to provide a current path from VCC to GND that passes through LHEAD, while switches S2 and S3 are open circuits (as shown in FIG. 1A). To change the direction of current flow to pass from node HY to node HX, switches S2 and S3 are closed, and switches S1 and S4 are open.

FIG. 1B shows a write driver circuit implementation of the prior art. NPN transistors Q101 and Q102 correspond to upper switches S1 and S2 of FIG. 1A. Schottky transistors Q103 and Q104 correspond to lower switches S3 and S4. The collectors of transistors Q101 and Q102 are coupled to VCC. The emitters of transistors Q101 and Q102 are coupled to nodes HX and HY, respectively. Resistors R111 and R112 are coupled to VCC and to the base junctions of transistors Q101 and Q102, respectively. The collectors of Schottky transistors Q103 and Q104 are coupled to nodes HX and HY, respectively. The emitters of Schottky transistors Q103 and Q104 are coupled to constant current source IW, which is in turn coupled to ground (GND). The base junction of transistor Q103 is coupled through resistor R113 to voltage input WDX. The base junction of transistor Q104 is coupled through resistor R114 to voltage input WDY. The collectors of Schottky transistors Q105 and Q106 are coupled to the base junctions of transistors Q101 and Q102, respectively. The emitters of transistors Q105 and Q106 are coupled together to constant current source I1. The base junctions of transistors Q105 and Q106 are coupled to voltage inputs WDX and WDY, respectively. Current source I1 is further coupled to ground.

The circuit of FIG. 1B operates from the differential voltage input provided by WDX and WDY. When WDX is at a higher potential than WDY, transistors Q103 and Q105 are conducting, whereas transistors Q104 and Q106 are not conducting. Transistor Q105 pulls down the base voltage of transistor Q101, shutting off the current through transistor Q101. The base junction of transistor Q102 is pulled near VCC by resistor R112, turning on transistor Q102. The H-bridge current path consists of transistor Q102, inductor LHEAD, transistor Q103 and current source IW.

When WDY is at a higher potential than WDX, transistors Q104 and Q106 are conducting, whereas transistors Q103 and Q105 are not conducting. Transistor Q106 pulls down the base voltage of transistor Q102, shutting off the current through transistor Q102. The base junction of transistor Q101 is pulled near VCC by resistor R111, turning on transistor Q101. The H-bridge current path becomes transistor Q101, inductor LHEAD, transistor Q104 and current source IW.

The Schottky transistors can be modeled as standard NPN transistors with a Schottky diode coupled between the base and collector junctions. The Schottky diode conducts current from the base to the collector when the base-collector voltage of the transistor becomes forward biased and reaches approximately 0.3 volts, depending on the device process. This action serves to clamp the base-collector voltage to a maximum of 0.3 volts. For an active transistor with a base-emitter voltage of 0.7 volts, the collector-emitter voltage may never drop below approximately 0.4 volts. Therefore, the clamped transistor cannot go into saturation and transistor switching speed can be maintained.

Transistors Q101 and Q102 do not require Schottky clamping because, in the circuit of FIG. 1B, the base-collector voltage of these devices can never exceed zero volts without shutting off the transistor.

Since the write head is an inductor, a certain amount of induced voltage appears across the inductive load. Rise and fall transition times, "$t_r$" and "$t_f$", of the head write current are given by the following equation:

$$t_r = t_f = L_h * \Delta I_h / V_h$$

where $L_h$ is the head inductance, $\Delta I_h$ is the change in current and $V_h$ is the available voltage across the write head, also referred to as the head voltage swing. Because the rise and fall times are inversely related to the head voltage swing, a higher head voltage swing provides shorter rise and fall transition times, e.g. faster performance. Therefore, it is desirable to maximize the available head voltage swing.

The head voltage swing is determined by the voltage range between the upper and lower power supplies that is not taken up by the devices in the current path. In the circuit of FIG. 1B, the head voltage swing is set by VCC less the minimum voltage across devices Q101, Q104 and IW (or, equivalently, devices Q102, Q103 and IW). The peak head voltage swing for FIG. 1B is given by:

$$V_h(\text{peak}) = VCC - (V_{BE} + V_{CE,min} + V_{IW})$$

where $V_h(\text{peak})$ is the head voltage swing, $V_{BE}$ is the base-emitter voltage of the upper active transistor, $V_{CE,min}$ is the minimum collector-emitter voltage of the lower active transistor, and $V_{IW}$ is the voltage across current source IW.

One method for improving the head voltage swing in low power applications with voltage supplies at or below five volts is discussed in U.S. Pat. No. 5,386,328 granted to Chiou et al., issued Jan. 31, 1995, and assigned to the assignee of the present invention. A method and apparatus are disclosed in the '328 patent for maximizing the head voltage swing in a limited supply voltage range such as 3.3 volts. The circuit of the '328 patent comprises a current mirror-based write driver. A symbolic diagram of this current mirror-based write driver is shown in FIG. 2A.

In FIG. 2A, upper switches S1 and S2 are positioned relative to the head inductor as in FIG. 1A. However, Switches S3 and S4 have been relocated to a parallel current path along with the current source IW/n. Coupled between nodes HX and HY and the ground node (GND) are current mirror blocks 210 and 202, respectively. Switch S3 is coupled between current source IW/n and current mirror 201. Switch S4 is coupled between current source IW/n and current mirror 202. Current source IW/n is further coupled to VCC. The inputs of current mirror blocks 201 and 202, originating from switches S3 and S4, are labeled IX and IY.

When switch S4 is closed, the current from current source IW/n is channeled to current mirror block 202. Current mirror block 202 draws current from node HY in response to the current supplied through switch S4. The current drawn from node HY is related to the current provided by current source IW/n by the ratio of 1:n, so that the current drawn from node HY is equal to IW. Current mirror block 201 provides the same current mirroring function to node HX when switch S3 is closed. When either of switches S3 or S4 are open, no current is provided to the corresponding current mirror block, and, therefore, no current is drawn from the respective head node.

FIG. 2B is a circuit diagram of elements S1, S2, LHEAD, 201 and 202 of FIG. 2A. In FIG. 2B, upper switches S1 and S2 are implemented with P-type FET devices M211 and M212, respectively. Current mirror block 201 comprises transistors Q221, Q223 and Q225, and resistor R232. Current mirror block 202 comprises transistors Q222, Q224 and Q226, and resistor R233. Resistor R231 is shared by both current mirror blocks.

Control voltage inputs GX and GY are provided to the gates of transistors M211 and M212, respectively. The sources of transistors M211 and M212 are coupled to VCC. The drains of transistors M211 and M212 are coupled to nodes HX and HY, respectively. The collectors of Schottky transistors Q221 and Q222 are coupled to nodes HX and HY respectively. The emitters of transistors Q221 and Q222 are commonly coupled through resistor R231 to ground. The collectors of transistors Q225 and Q226 are coupled to VCC. The emitter of transistor Q225 is coupled to the base junctions of Schottky transistors Q221 and Q223. The emitter of transistor Q226 is coupled to the base junctions of Schottky transistors Q222 and Q224. Current input IX is coupled to the base junction of transistor Q225 and the collector junction of transistor Q223. Current input IY is coupled to the base junction of transistor Q226 and the collector junction of transistor Q224. The emitter junction of transistor Q223 is coupled through resistor R232 to ground. The emitter junction of transistor Q224 is coupled through resistor R233 to ground.

Current is provided through either input IX or input IY at any one time. If current is being supplied to input IX, suitable voltage signals are applied to the gates of transistors M211 and M212 such that transistor M211 presents an open circuit between node HX and VCC, and transistor M212 presents a low resistance (closed circuit) between node HY and VCC. If current is supplied to input IY, suitable voltage signals are applied to the gates of transistors M211 and M212 such that transistor M212 presents an open circuit and transistor M211 presents a low resistance path.

For current mirror block 201, comprised of transistors Q221, Q223 and Q225, operation is as follows. When current is supplied to input IX, substantially all of the current supplied is channeled through the collector and emitter of transistor Q223. The voltage at the emitter of transistor Q223 is equal to the voltage drop across resistor R232 generated by the current from input IX. Because transistors Q221 and Q223 share a common base node, and because their VBE voltage drops are substantially the same, the emitter voltage of transistor Q221 is substantially equal to the emitter voltage of transistor Q223. Therefore, the voltage drop across resistor R231 is equal to the voltage drop across resistor R232. The current through resistor R231 and transistor Q221 is then equal to the current from input IX modified by a ratio consisting of the resistance of R232 over the resistance of R231 (or R232/R231). If R232/R231 is equal to "n", and the current at IX is IW/n, then the current drawn from node HX is IW. The base current of transistor Q223 and the proportionally larger base current of transistor Q221 are provided by transistor Q225. Because the current gain through transistor Q225 is relatively large ($\beta \gg 1$), the base current drawn by transistor Q225 to provide base current for transistors Q221 and Q223 is negligible compared to current input IX. When no current is supplied to input IX, transistors Q221, Q223 and Q225 are substantially non-conducting. The operation of current mirror block 202 is similar to that of current mirror block 201 described above.

The head voltage swing of the circuit of FIG. 2B is determined by the voltage drop across the upper P-type FET switch, the collector-emitter voltage of the active lower Schottky transistor (Q221 or Q222), and the voltage drop across resistor R231:

$$V_h(\text{peak}) = VCC - (V_{SD} + V_{CE,min} + V_{R231})$$

where $V_{SD}$ is the source-drain voltage of FET M211 or M212, $V_{CE,min}$ is the collector-emitter voltage of either transistor Q221 or Q222, and $V_{R231}$ is the voltage drop across resistor R231. The peak head voltage swing in the circuit of FIG. 2B provides at least 0.7 volts more head voltage swing than the circuit of FIG. 1B, which may be significant in low power applications operating with power supplies of five volts or less.

However, the circuits of the prior art, while attempting to optimize head voltage swing inside of a set voltage supply range, have an inherent limitation in the maximum range of the power supply, and hence a design limitation on the head voltage swing available. As shown above in the head voltage swing equations for the circuits of FIGS. 1B and 2B, the head voltage swing is comprised of several substantially constant voltage components and one varying voltage component. This varying component is the collector-emitter voltage of the lower switch transistor or lower current mirror transistor (Q221 or Q222 in FIG. 2B). This collector-emitter voltage absorbs all of the voltage swing of the inductive load. The complete head voltage swing is therefore not only dependent on the minimum collector-emitter voltage of these critical transistors, but on the maximum collector-emitter voltage of these devices when in a non-conducting state, i.e., the breakdown voltage, $BV_{CEO}$. If the voltage across the non-conducting lower transistor exceeds the breakdown voltage, breakdown will occur and the transistor will not remain in the desired "off" state.

FIG. 3A illustrates the relative waveforms of the voltage levels at nodes HX and HY during a write current reversal. The associated inductor current waveform is illustrated in FIG. 3B. In FIG. 3A, before the transition, nodes HX and HY are offset by a small voltage due to the steady state current +IW and the series resistance of the inductor. The upper voltage node is pulled near the upper voltage rail (power supply) by the closed upper switch S1. For the circuit of FIG. 1B, node HX is initially at approximately 0.7 volts below VCC in steady state with positive current flow (current flowing from node HX to node HY). For the circuit of FIG. 2B, node HX is initially very near VCC.

In the transition period, as the write current changes polarity, the head voltage switches polarity with a large spike of magnitude $V_h(peak)$. The voltage at node HY is pulled near the upper voltage rail by newly closed upper switch S2. Node HX absorbs the majority of the induced head voltage swing $V_h(peak)$, to the extent allowed by the circuit design, before settling into steady state. In the new steady state, node HX is slightly offset below node HY due to the negative current flowing through the inductor series resistance.

As shown above, the head voltage swing limits the transition rate of the head current waveform. Therefore, the head voltage swing must be maximized to increase the current transition rate. However, the H-bridge circuit designs of the prior art are subject to device process limitations. For instance, in a five volt process, semiconductor devices can break down ($BV_{CEO}$) at as low as 5.5 volts. This proves to be a limiting factor when larger head voltage swings are required, for instance, when VCC is raised from five volts to twelve volts. A weak point in the circuits of the prior art, under these conditions, is the lower switch which should maintain an open circuit in steady state. The lower switch will conduct undesired current when the voltage across its terminals exceeds the device breakdown voltage ($BV_{CEO}$ for bipolar junction transistors). This weakness is directly related to the peak head voltage swing, as the voltage across the open lower switch is equal to the voltage across the head inductor and the closed lower switch during peak swing. For example, in the circuit of FIG. 2B:

$$VCC - (V_{SD} + V_{R231}) = V_{CE,off} < BV_{CEO} \text{ (steady state)}$$

which provides, $$V_h(peak) + V_{CE,min} = V_{CE,off} < BV_{CEO} \text{ (in transition)}$$

$$V_h(peak) < BV_{CEO} - V_{CE,min}$$

For $BV_{CEO}$ around 5.5 volts, this provides for a maximum allowable VCC of slightly more than 5.5 volts, and a maximum achievable $V_h(peak)$ of slightly less than 5.5 volts.

A second point of weakness in the circuits of the prior art is the open-circuit upper switch during transition. For the circuit of FIG. 1B:

$$V_h(peak) + V_{BE,on} = V_{CE,off} < BV_{CEO}$$

$$V_h(peak) < BV_{CEO} - V_{BE,on}$$

which provides for a maximum head voltage swing near 4.8 volts for $BV_{CEO} \approx 5.5$ volts and $V_{BE,on} \approx 0.7$ volts. The loss in maximum swing caused by the base-emitter voltage $V_{BE,on}$ can be reduced by using FETs as shown in FIG. 2B. The FETs have a gate-drain maximum voltage $V_{GD,max}$, as well as a gate-source maximum voltage $V_{GS,max}$, beyond which the performance of the FET devices is no longer reliable. In a five volt BiCMOS process, these process determined maximum voltages can be in the range of 5.5 volts. For the circuit of FIG. 2B:

$$V_h(peak) + V_{SD,on} = V_{SD,off} < V_{GD,max}$$

$$V_h(peak) < V_{GD,max} - V_{SD,on}$$

which provides for a maximum head voltage swing near 5.5 volts for $V_{GD,max} \approx 5.5$ volts. This head swing limitation illustrates an undesired design limitation in the circuits of the prior art.

SUMMARY OF THE INVENTION

The present invention is a cascode H-bridge circuit with particular application to magnetic recording write driver circuits. The present invention avoids the process dependent limitations placed on the head voltage swing in the H-bridge circuits of the prior art. Whereas the circuits of the prior art attempt to increase head voltage swing by minimizing device voltage drops in the current path, the present invention inserts cascode transistors in the current path that have less than a one-volt voltage drop when active, yet allow the circuit to operate under a higher voltage supply with roughly twice the head voltage swing available in the same process in the prior art. By implementing a cascode configuration, the present invention is able to support head voltage swings in excess of the switch breakdown voltage ($BV_{CEO}$) without failure of the switches in the "off" state.

In the preferred embodiment of the present invention, cascode transistors are coupled between each switch and the inductive load. The cascode transistors are coupled and biased to switch off automatically when required to provide cumulative protection against device breakdown. In this manner, the cascode transistors are self-switching. The cascode transistor and the corresponding switch transistor combine to form a cascode switching element. Upper FET cascode transistors are biased to be conducting when the voltage across the transistor is in the safe range of the upper switch. When the voltage across the FET cascode transistor becomes large, as when the inductor terminal experiences a voltage spike, the FET cascode transistor turns off, combining its maximum allowable voltage with that of the original upper switch to provide twice the reliability protection of prior art circuits. Lower cascode Schottky transistors are base-coupled through resistors to a second bias voltage. The resistors enable the collector and emitter voltages of the cascode transistor to flex downwards with sharp downward voltage spikes to provide good compliance, i.e. maximum voltage range. When the lower switches are turned off, the associated cascode device shuts off due to lack of current. When shut off, the lower cascode Schottky transistor and the lower switch provide a breakdown voltage rating twice as large as the prior art. Both traditional and current mirror-based H-bridge implementations are provided.

DETAILED DESCRIPTION OF THE INVENTION

The present invention is a self switched cascode H-bridge configuration with particular application to write driver circuits. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

Figure 4:
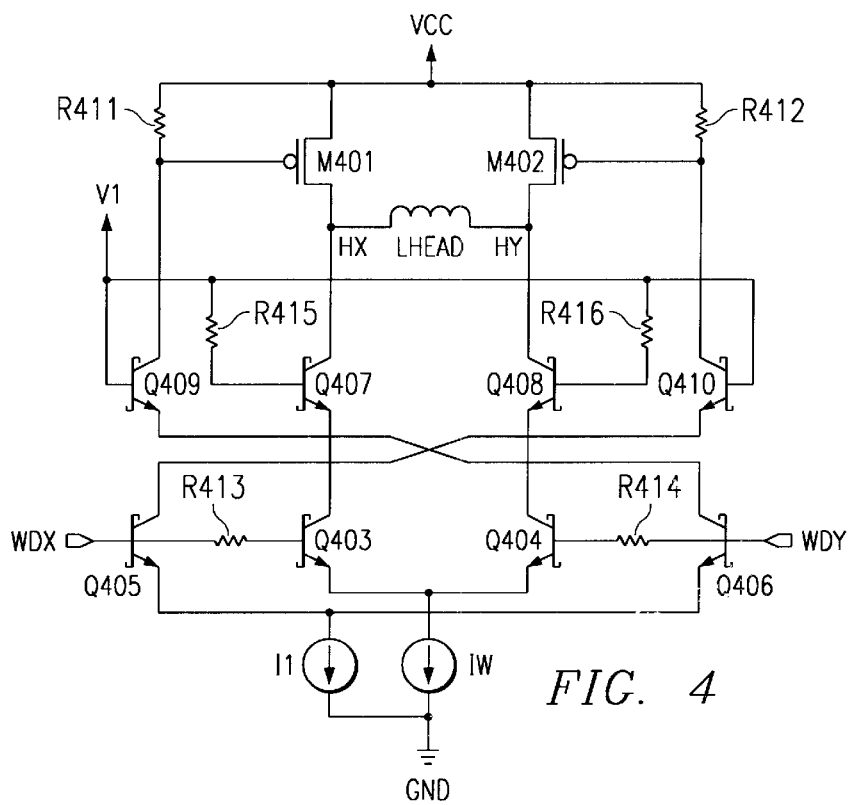
FIG. 4 is a first embodiment of the high voltage swing write driver.

FIG. 4 illustrates one embodiment of a write driver in accordance with the present invention. The magnetic head (LHEAD) is connected between nodes HX and HY. The drains of P-type FETs (or PFETs) M401 and M402 are coupled to nodes HX and HY, respectively. The sources of FETs M401 and M402 are coupled to VCC. Resistor R411 is coupled between the gate of FET M401 and VCC. Resistor R412 is coupled between the gate of FET M402 and VCC. The collectors of Schottky cascode transistors Q407 and Q408 are coupled to nodes HX and HY, respectively. The collectors of Schottky transistors Q403 and Q404 are coupled to the emitters of cascode transistors Q407 and Q408, respectively. The emitters of transistors Q403 and Q404 are jointly coupled through current source IW to ground (GND).

The collector of Schottky transistor Q409 is coupled to the gate of FET M401. The emitter of transistor Q409 is coupled to the collector of Schottky transistor Q406. The collector of Schottky transistor Q410 is coupled to the gate of FET M402. The emitter of transistor Q410 is coupled to the collector of Schottky transistor Q405. The emitters of transistors Q405 and Q406 are jointly coupled through current source I1 to ground.

Bias voltage V1 is coupled to the base junctions of transistors Q409 and Q410. Further, bias voltage V1 is provided through resistors R415 and R416 to the base junctions of cascode transistors Q407 and Q408, respectively. The bias voltage is positioned roughly midway in the voltage swing region to allow maximum benefit from the cascode transistors.

Due to the clamping effect of the Schottky transistors, resistors R415 and R416 provide for the base voltage of transistors Q407 and Q408, respectively, to be pulled downward while conducting in the transition state. This aspect maintains good head voltage swing by improving the compliance of the cascode structure despite the addition of an element into the active current path. In other words, during the transition, the cascode transistor Q407/Q408 takes up very little voltage (i.e. $V_{CE,min}$), allowing the head voltage swing to approach the supply voltage. In steady state, the cascode transistors will self-switch to high VCE to prevent the breakdown of Q403/Q404. The resistance values of R415 and R416 are chosen to be large enough to provide the base nodes sufficient isolation to be pulled down, yet small enough to maintain the transition speed of the circuit.

The write driver is driven by a differential write data voltage signal at WDX and WDY signal nodes. Signal WDX is provided to the base junction of transistor Q405 and through resistor R413 to the base junction of transistor Q403. Signal WDY is provided to the base junction of transistor Q406 and through resistor R414 to the base junction of transistor Q404. Emitter-coupled pairs Q403-Q404 and Q405-Q406 act as differential switches for their respective constant current sources, IW and I1. Transistor pair Q405 and Q406 control the current drawn through resistors R411 and R412, thereby controlling the gate voltages of transistors M401 and M402. When signal node WDX is at a higher potential than signal node WDY, transistors Q403, Q405, Q407, Q410 and M402 are conducting. Transistors Q404, Q406, Q408, Q409 and M401 are shut off. Conversely, when signal node WDY is at a higher potential than signal node WDX, transistors Q404, Q406, Q408, Q409 and M401 are conducting, and transistors Q403, Q405, Q407, Q410 and M402 are shut off.

The switching off of transistors Q407–Q410 is accomplished automatically by the cessation in current drawn from the transistor coupled to their respective emitter. Further, the emitter current drawn through transistors Q407–Q410 when active is equal to the collector current of the lower transistor coupled to their respective emitter.

An advantage gained by the circuit of FIG. 4 over those of the prior art is that the breakdown voltage of the cascode configuration is roughly equal to the sum of the breakdown voltages for each transistor in the non-conducting path. Therefore, the combined breakdown voltage of the lower switches in the present invention is approximately equal to ($2 \times BV_{CEO}$), twice that of the circuits of the prior art. It is therefore possible to use a five volt process with a higher valued voltage supply without Schottky NPN transistor performance failure and with increased head voltage swing.

It is possible to provide further levels of cascode devices to increase the breakdown voltage gained by approximately $BV_{CEO}$ per level of cascode devices. The voltage supply can thus be increased by substantially the same amount. The cost of adding the cascode transistor is the minimum device voltage drop placed in the active current path. For each level of cascode devices, the portion of the voltage supply provided for head voltage swing is decreased by $V_{CE,min}$ or roughly 0.4 volts for the Schottky transistors. For $BV_{CEO}$ of around five volts, the advantage gained by adding the cascode device far outweighs the cost. The number of levels of cascode devices used is determined by the voltage supply and head voltage swing requirements of the specific application.

Figure 5:
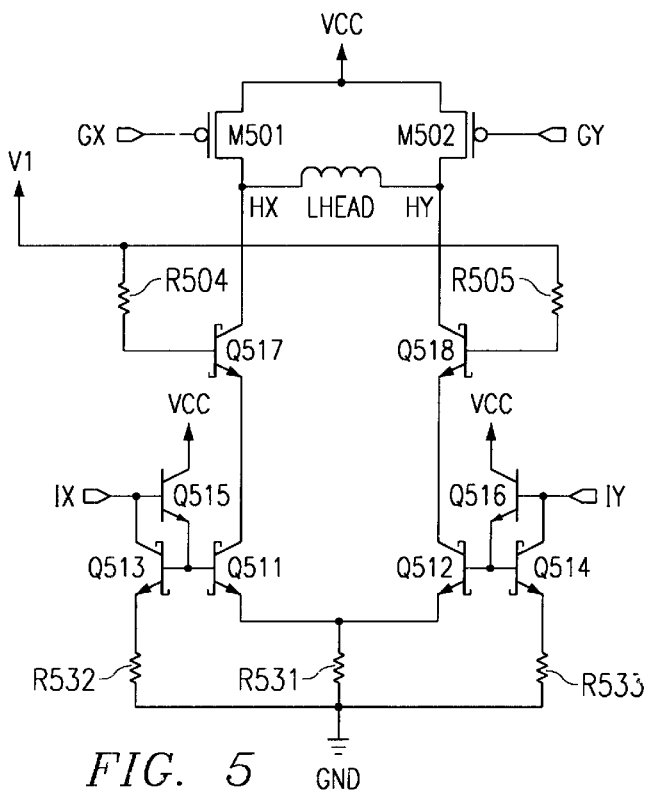
FIG. 5 is a second embodiment of the high voltage swing write driver.

Another embodiment of the present invention is shown in FIG. 5. The circuit of FIG. 5 uses current mirrors to operate as the lower switches of the H-bridge. The gates of the upper PFET switches are driven by voltage signals GX and GY, and the lower current mirrors are driven by current signals IX and IY.

In FIG. 5, PFETs M501 and M502 couple nodes HX and HY, respectively, to VCC. Inductive load LHEAD is coupled across nodes HX and HY. The gates of PFETs M501 and M502 are driven by voltage signals GX and GY respectively. The collectors of Schottky cascode transistors Q517 and Q518 are coupled to nodes HX and HY respectively. The bases of transistors Q517 and Q518 are coupled through resistors R504 and R505, respectively, to bias voltage V1. The emitters of transistors Q517 and Q518 are coupled to the collectors of Schottky current mirror transistors Q511 and Q512, respectively.

The emitters of transistors Q511 and Q512 are jointly coupled through resistor R531 to ground (GND). The emitters of Schottky transistors Q513 and Q514 are coupled through resistors R532 and R533, respectively, to GND. The base of transistor Q511 is coupled to the base of transistor Q513 and the emitter of non-Schottky clamped transistor Q515. The base of transistor Q512 is coupled to the base of transistor Q514 and the emitter of non-Schottky clamped transistor Q516. The collectors of transistors Q515 and Q516 are coupled to VCC. The base of transistor Q515 and the collector of transistor Q513 are jointly driven by current input IX. The base of transistor Q516 and the collector of transistor Q514 are jointly driven by current input IY.

Figure 1A:
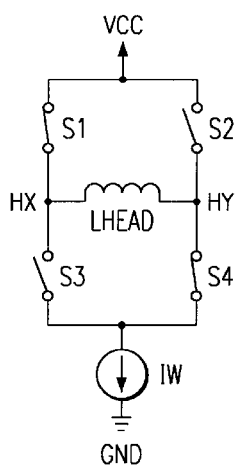
FIG. 1A is a conceptual circuit diagram of an H-bridge circuit.
Figure 1B:
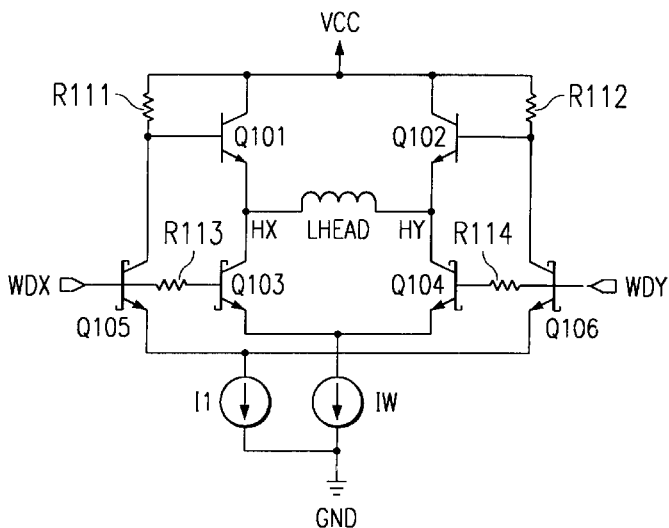
FIG. 1B is a schematic diagram of an H-bridge circuit of the prior art.
Figure 2A:
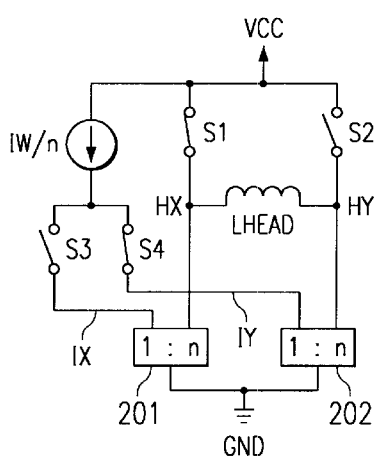
FIG. 2A is a conceptual circuit diagram of a current mirror-based write driver of the prior art.
Figure 2B:
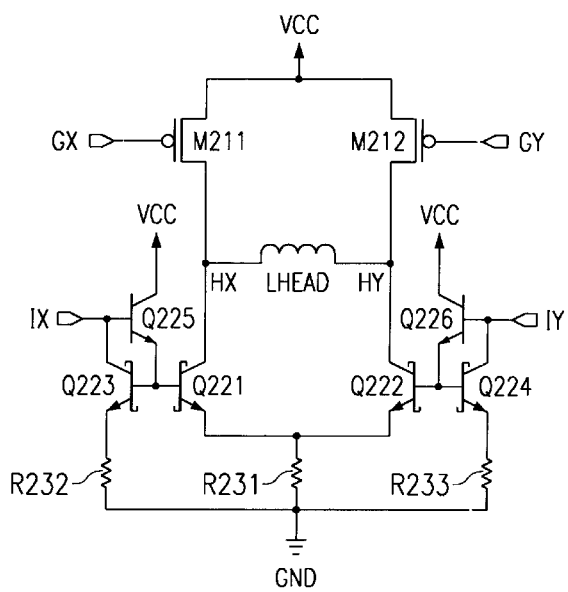
FIG. 2B is a schematic diagram of the current mirror-based write driver of the prior art.
Figure 3A:
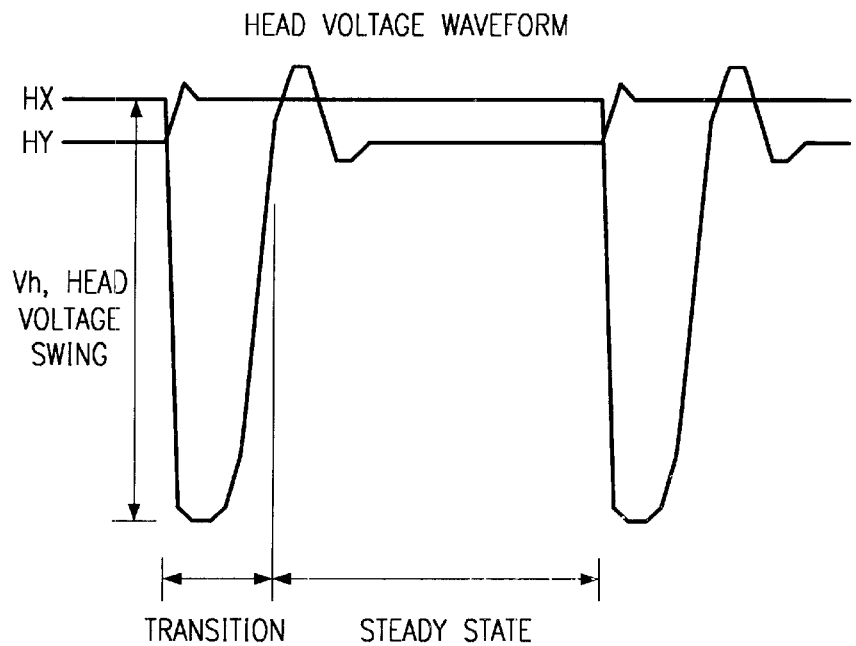
FIG. 3A illustrates voltage waveforms seen at both terminals of an inductive load in an H-bridge configuration.
Figure 3B:
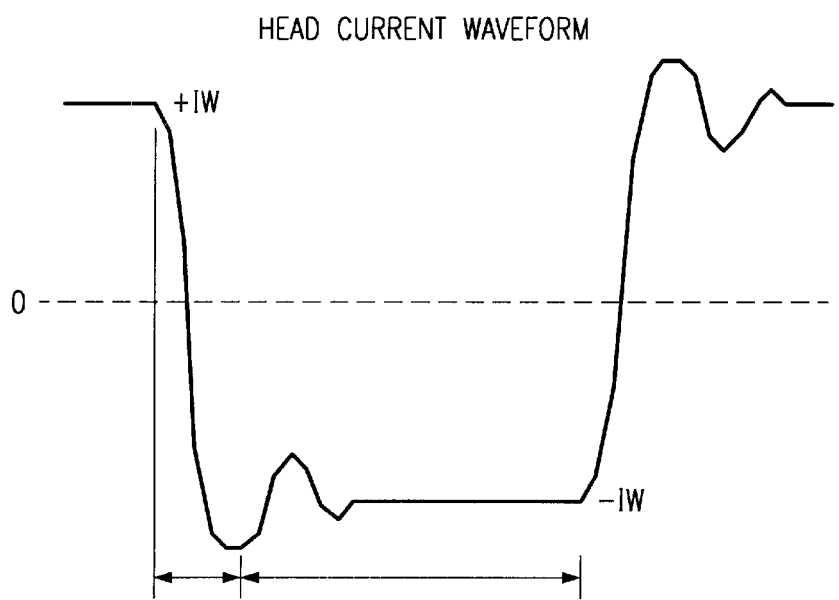
FIG. 3B illustrates a head current waveform of an inductive load in an H-bridge configuration.

The behavior of the circuit of FIG. 5 is similar to that of FIG. 2B, but the circuit of FIG. 5 gains the advantages of the cascode configuration in reducing the process dependency of the voltage supply range and the head voltage swing. As in the circuit of FIG. 4, cascode transistors Q517 and Q518 are automatically switched on and off by the conduction state of transistors Q511 and Q512 respectively. Bias voltage V1 is selected near the middle of the head voltage swing to provide optimum use of the collector-emitter voltage range of the cascode device and the lower switch transistor.

More than one BJT cascode level may also be used. For example, in FIG. 5, another pair of Schottky transistors may be coupled between transistor Q517 and node HX, and between transistor Q518 and node HY, respectively. When multiple BJT cascode levels are used, bias voltage levels are set so as to subdivide the head voltage range into roughly equal portions.

Figure 6A:
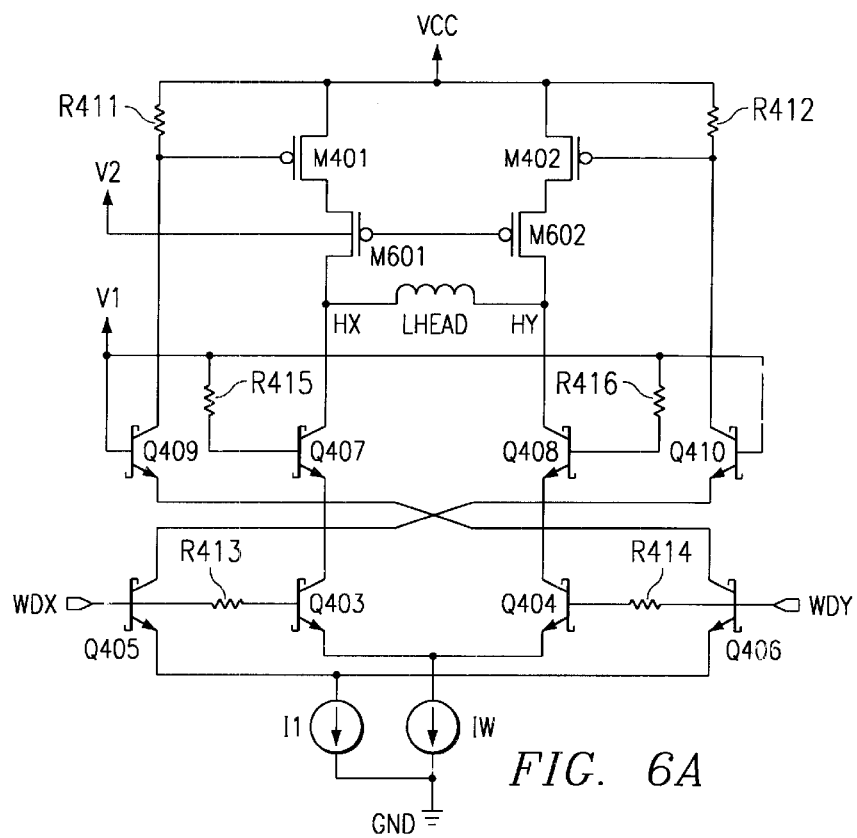
FIG. 6A is a third embodiment of the high voltage swing write driver.

The circuit of FIG. 6A is a third embodiment of the present invention. FIG. 6A is similar to the circuit of FIG. 4, but includes an upper switch cascode configuration to provide protection against excessive $V_{GD}$ or $V_{GS}$ voltages in the PFET switches, which may affect the reliability of the FETs. The PFET cascode devices are transistors M601 and M602, coupled between transistor M401 and node HX and between transistor M402 and node HY, respectively. The gates of these cascode PFETs are coupled to a second bias voltage V2, which is typically located at VCC–$V_{GS,max}$, where $V_{GS,max}$ is the maximum gate-source/gate-drain voltage that still assures FET reliability. It is possible for bias voltages V1 and V2 to be the same. If multiple levels of cascode PFETs are used, the bias voltages should divide up the head voltage swing range equally to provide balanced protection from each PFET device.

Figure 6B:
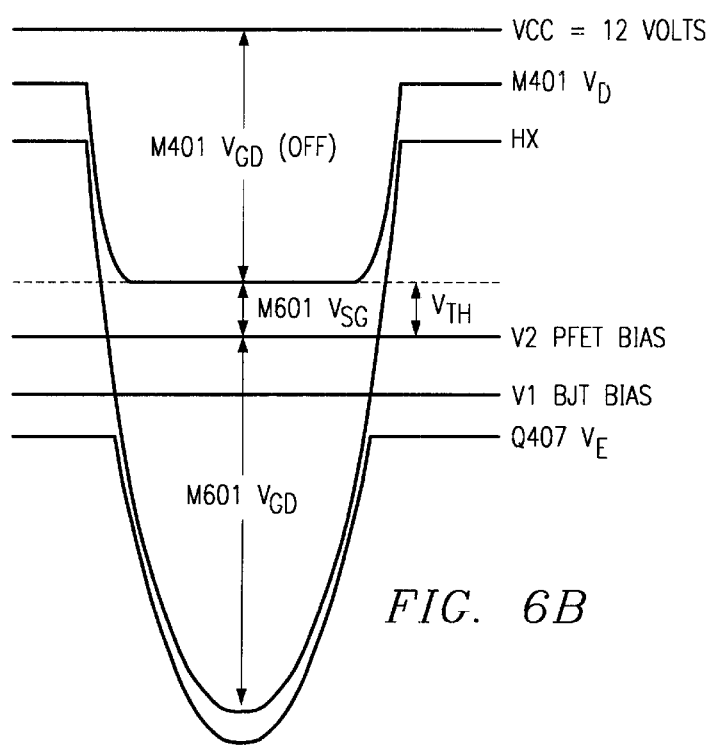
FIG. 6B is a voltage diagram for the circuit of FIG. 6A during a transition period.

In a transition period, the cascode PFET corresponding with the non-conducting upper switch is not immediately turned off. The cascode PFET acts as a low impedance up to the point in the transition spike where the source voltage has dropped sufficiently near the bias voltage V2 for the source-gate voltage of the cascode transistor to fall below the turn-on threshold voltage of the device. At this point, the cascode device automatically shuts off, providing a very high impedance. FIG. 6B illustrates the behavior of the non-conducting upper cascode PFET switch during a transition period.

FIG. 6B refers to a transition period in which PFETs M401 and M601 represent the non-conducting upper switch. Constant voltages are provided by VCC at twelve volts, and bias voltages V1 and V2 near the center of the transition range. With the circuit of FIG. 6A, no current is passed through resistor R411, and the gate voltage of PFET M401 is equal to VCC during this example transition period. A dashed line is drawn above bias voltage V2. Bias voltage V2 is the gate voltage of cascode PFET M601, and the dashed line indicates the voltage level at which PFET M601 switches between high and low impedance. The voltage difference between the dashed line and bias voltage V2 is equal to the source-gate threshold turn-on voltage of the PFET.

Initially, PFETs M401 and M601 are in low impedance mode with only a small voltage drop across each PFET. When the switch occurs, PFET M401 is shut off immediately, and the voltage at node HX begins falling sharply. PFET M601 continues to act as a low impedance. Consequently, the drain voltage of PFET M401 (M401 $V_D$) follows the descent of the voltage at node HX. At the dashed line, PFET M601 switches to high impedance as its source-gate voltage falls below the turn-on threshold ($V_{TH}$, typically around one volt). M401 $V_D$ is clamped at the dashed line until the source-gate voltage of PFET M601 rises above $V_{TH}$. The drain voltage of PEET M601 (M601 $V_D$) tracks the induced voltage on node HX. The voltage at the emitter of transistor Q407 is shown to illustrate how the Schottky clamping of the cascode transistor draws the base and emitter of the cascode device downward with the voltage excursion at node HX.

The PFET bias voltage V2 is selected to satisfy the following two conditions:

$$V2 > VCC - (V_{GD,max} + V_{TH}) \quad \text{i)}$$

$$V2 < VCC - (V_{h,peak} - V_{GD,max}) \quad \text{ii)}$$

These conditions protect PFETs M401 and M601 from excessive $V_{GS}$ and $V_{GD}$ voltages, and avoid possible reliability problems.

Figure 6C:
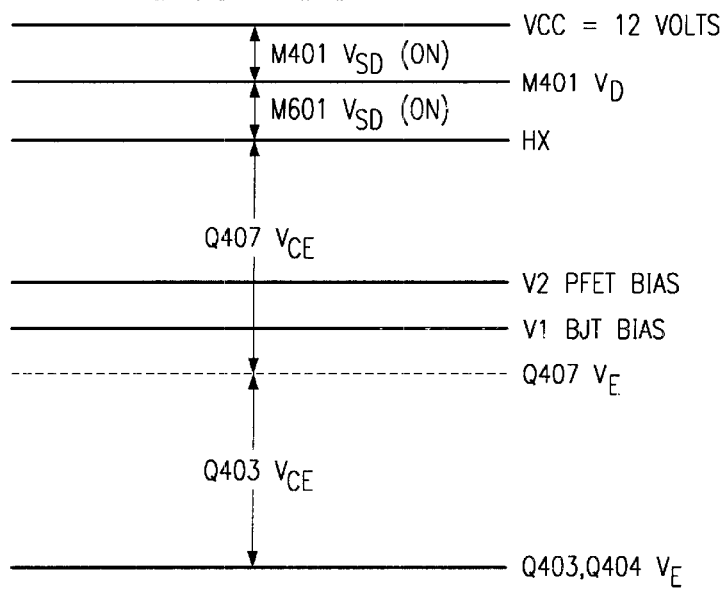
FIG. 6C is a voltage diagram for the circuit of FIG. 6A in steady state.

FIG. 6C illustrates the steady state situation with PFETs M401 and M601 conducting and transistors Q403 and Q407 shut off. The upper limit is set by VCC at twelve volts. The voltage drops of PFETs M401 and M601 establish the voltage level of node HX, and thus the collector voltage of transistor Q407, near VCC. The bias voltage V1 determines the emitter voltage of transistor Q407. The emitter voltage Q407 $V_E$ is roughly one diode voltage drop, or base-emitter turn-on voltage ($V_{BE,on}$), below V1, shown as a dashed line. The emitter voltage of transistor Q403 is $V_{BE,on}$ below the voltage of the WDX or WDY inputs, whichever is higher.

To avoid breakdown of transistor Q407, bias voltage V1 should satisfy the following inequality:

$$V1 > VCC + V_{BE,on} - (2VSD, \text{on} + BV_{CEO}) \qquad \text{iii)}$$

Further, to prevent breakdown of transistor Q403, $$V1 < V_{IW,min} + BV_{CEO} + V_{BE,on} \qquad \text{iv)}$$

where $V_{IW,min}$ is equal to $(WDX - V_{BE,on})$ or $(WDY - V_{BE,on})$.

A single bias voltage source may be used to provide V1 and V2, if the bias value meets the conditions of inequalities (i)–(iv).

Figure 7:
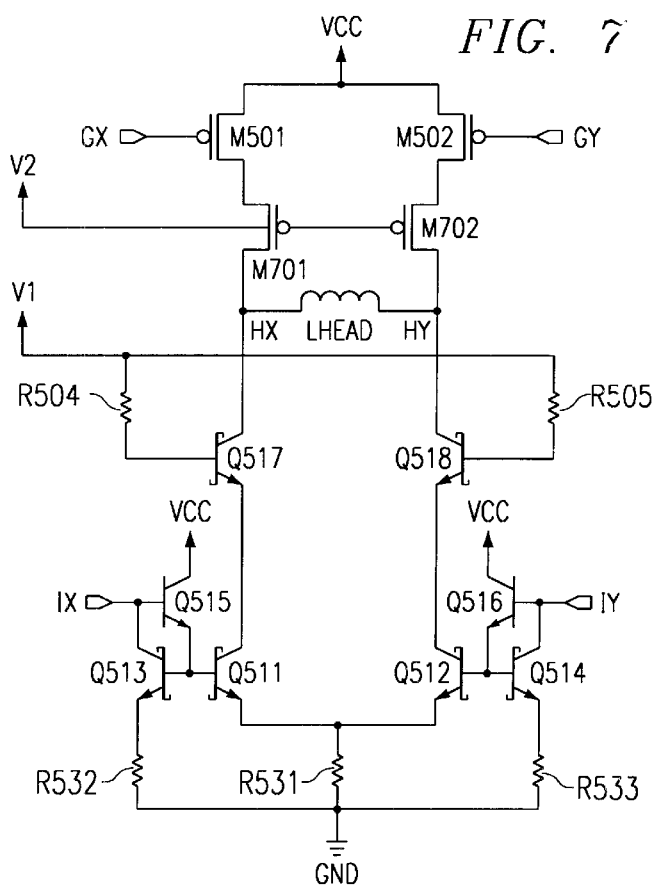
FIG. 7 is a fourth embodiment of the high voltage swing write driver.

FIG. 7 is a circuit diagram of a fourth embodiment of the present invention, implementing a current mirror-based H-bridge configuration. The circuit of FIG. 7 is similar to the circuit of FIG. 5, but includes the addition of cascode devices for protection of the upper switches. The cascode devices consist of PFETs M701 and M702, coupled between PFET M501 and node HX, and PFET M502 and node HY, respectively. As in the circuit of FIG. 6A, the gates of PFETs M701 and M702 are coupled to bias voltage V2. The circuit is driven as described with reference to FIG. 5. Operation of the cascode elements is as described with reference to FIGS. 6A–6C.

By using the method of the present invention, it is possible to use lower voltage device processes (e.g. a five volt process) in a driver circuit using a higher supply voltage (e.g. twelve volts) for increased voltage swing. The limitation placed on head voltage swing in the circuit of FIG. 7 is:

$$V_h(\text{peak}) < 2BV_{CEO} - 2V_{CE,min}$$

This is twice the voltage limit attainable by the circuits of the prior art. With twice the head voltage swing of the prior art, the rise and fall times of the head current signal can be reduced by a factor of two.

Thus, a self switched cascode H-bridge circuit has been described.

What is claimed is:

1. An H-bridge circuit comprising:
   a load having a first and a second port;
   first and second switches coupled to said first and said second port to switch the load;
   first and second cascode switching elements coupled between said load and said first and said second switches;
   wherein said first and second cascode switching elements each comprising at least one cascode transistor having a base port resistively coupled to a first bias voltage and a collector port clamped with respect to said base port.

2. The H-bridge circuit of claim 1 wherein said first and second switches are FET devices.

3. The H-bridge circuit of claim 1 wherein said load is inductive.

4. The H-bridge circuit of claim 1 wherein said cascode transistors comprise Schottky bipolar junction transistors.

5. The H-bridge circuit of claim 1 further comprising a third cascode transistor coupled between said first switch and said first port, and a fourth cascode transistor coupled between said second switch and said second port.

6. The H-bridge circuit of claim 5 wherein said third and fourth cascode transistors comprise FET transistors, said third and fourth cascode transistors having gate ports coupled to said first bias voltage.

7. The H-bridge circuit of claim 5 wherein said third and fourth cascode transistors comprise FET transistors, said third and fourth cascode transistors having gate ports coupled to a second bias voltage.

8. The H-bridge circuit of claim 1 wherein said first and second cascode switching elements further comprise current mirrors.

9. An H-bridge circuit comprising:
   an inductive load having a first port and a second port;
   first and second switches coupled to said first port to switch said inductive load;
   third and fourth switches coupled to said second port to switch said inductive load;
   first and second cascode transistors coupled between said first and second switches respectively and said inductive load;
   third and fourth cascode transistors coupled between said third and fourth switches respectively and said inductive load;
   wherein only one of said first and second switches conducts at any one time and only one of said third and fourth switches conducts at any one time; and
   wherein said second and fourth cascode transistors each comprises a transistor having a base port resistively coupled to a first bias voltage and a collector port clamped with respect to said base port.

10. The H-bridge circuit of claim 9 further comprising a current source coupled to said second and fourth switches.

11. The H-bridge circuit of claim 10 wherein said second and fourth switches comprise current mirrors.

12. The H-bridge circuit of claim 9 wherein said first and third switches and said first and third cascode transistors comprise FET transistors.

13. The H-bridge circuit of claim 12 wherein said first and third cascode transistors each have a gate port coupled to a second bias voltage.

14. The H-bridge circuit of claim 9 wherein said second and fourth cascode transistors comprise Schottky bipolar junction transistors.

15. The H-bridge circuit of claim 13 wherein said first and second bias voltages are equal.

16. The H-bridge circuit of claim 12 wherein said FETs are P-type field effect transistors.

17. The H-bridge circuit of claim 9 wherein said switches and said cascode transistors are generated from a five volt BiCMOS process, and wherein said circuit further comprises a power supply in excess of five volts.

18. A circuit comprising:
   a load having a first port and a second port;
   a first switch coupled between a first node and said first port to switch said load;
   a second switch coupled between said first node and said second port to switch said load;
   a third switch coupled to a second node to switch said load;

a fourth switch coupled to a second node to switch said load;

a first cascode transistor coupled between said third switch and said first port, said first cascode transistor having a base port resistively coupled to a first bias voltage and a collector port clamped with respect to said base port; and a second cascode transistor coupled between said fourth switch and said second port, said second cascode transistor having a base port resistively coupled to said first bias voltage and a collector port clamped with respect to said base port.

19. The circuit of claim 18 further comprising a load coupled between said first port and said second port.

20. The circuit of claim 18 further comprising a current source coupled to said second node.

21. The circuit of claim 18 further comprising:

a third cascode transistor coupled between said first switch and said first port, said third cascode transistor coupled to a second bias voltage; and a fourth cascode transistor coupled between said second switch and said second port, said fourth cascode transistor coupled to said second bias voltage.

22. The circuit of claim 21 wherein said first and second bias voltages are at equal potential.

23. The circuit of claim 18 wherein said third switch and said fourth switch each comprise current mirrors.

24. The circuit of claim 18 wherein said first node is coupled to a voltage supply having a voltage value.

25. The circuit of claim 24 wherein said third switch and said fourth switch each comprise at least one transistor having a breakdown voltage rating lower than said voltage value of said voltage supply.

26. The circuit of claim 18 wherein said first cascode transistor and said second cascode transistor each comprise a Schottky bipolar junction transistor.

* * * * *